United States Patent
Harvey

[11] Patent Number: 6,057,227
[45] Date of Patent: May 2, 2000

[54] OXIDE ETCH STOP TECHNIQUES FOR UNIFORM DAMASCENE TRENCH DEPTH

[75] Inventor: Ian Harvey, Livermore, Calif.

[73] Assignee: VLSI Technology, Inc., San Jose, Calif.

[21] Appl. No.: 08/880,580

[22] Filed: Jun. 23, 1997

[51] Int. Cl.$^7$ ............................................. H01L 21/4763
[52] U.S. Cl. .................. 438/626; 438/627; 438/629; 438/637; 438/722; 438/638; 438/639
[58] Field of Search ............................. 438/50, 403, 626, 438/586, 587, 638, 624, 640, 672, 700, 633, 639, 696, 701, 713, 740, 627, 637, 722

[56] References Cited

U.S. PATENT DOCUMENTS

| | | | |
|---|---|---|---|
| 5,403,780 | 4/1995 | Jain et al. | 437/195 |
| 5,619,072 | 4/1997 | Mehta | 257/774 |
| 5,635,423 | 6/1997 | Huang et al. | 438/638 |
| 5,677,563 | 10/1997 | Cronin et al. | 257/506 |
| 5,705,430 | 1/1998 | Avanzino et al. | 437/195 |
| 5,708,303 | 1/1998 | Jeng | 257/758 |
| 5,795,823 | 6/1995 | Avanzino et al. | 438/639 |
| 5,801,094 | 6/1997 | Yew et al. | 438/624 |
| 5,849,367 | 12/1996 | Dixit et al. | 427/535 |

*Primary Examiner*—Chandra Chaudhari
*Assistant Examiner*—Reneé R. Berm
*Attorney, Agent, or Firm*—Wagner,Murabito&Hao LLP

[57] ABSTRACT

A damascene structure and method for forming such structure. In one embodiment, the damascene structure of the present invention includes a first layer of oxide which is a stochiometric oxide deposited onto a semiconductor substrate. A second layer of oxide which is a non-stochiometric oxide is then deposited onto the semiconductor substrate which is followed by a stochiometric oxide layer. The semiconductor substrate is then masked and etched so as to form vias using a selective etch process which etches the stochiometric oxide and stops etching on the non-stochiometric oxide layer. The etch chemistry is then changed in-situ, allowing the removal of the non-stochiometric oxide at the bottom of the via. The wafer is then re-masked in the pattern of trench interconnect using a selective etch process to selectively etch the layer of stochiometric oxide in the damascene trench down to the layer of non-stochiometric oxide while simultaneously completing the etching of vias. The use of the layer of non-stochiometric oxide as an etch stop gives trenches with a substantially planar bottom surface in a process superior in simplicity and process margin compared to nitride etch stop technologies. Metal is deposited over the semiconductor substrate and is polished so as to remove the metal which overlies the layer of stochiometric oxide so as to form interconnects having uniform depth and contacts. In an alternate embodiment, a damascene structure is formed without the deposition of the first stochiometric oxide layer and etched using an initial non selective etch.

9 Claims, 7 Drawing Sheets

6,057,227

OXIDE ETCH STOP TECHNIQUES FOR UNIFORM DAMASCENE TRENCH DEPTH

TECHNICAL FIELD

The present claimed invention relates to the field of semiconductor devices. More specifically, the present claimed invention relates to a damascene formed structure and methods for forming damascene structures.

BACKGROUND ART

Computer chip manufacturing processes typically include the formation of p-n junctions in a semiconductor substrate which are connected by polysilicon which is deposited, masked, and etched to form a patterned polysilicon surface. The patterned polysilicon surface connects with the p-n junctions so as to form numerous semiconductor devices on the semiconductor substrate. Typically, one or more layers of dielectric is then deposited over the surface of the semiconductor. The dielectric is then masked and etched to expose portions of the polysilicon surface or "gate", as well as diffusion areas (sources and drains) through openings which are commonly referred to as contacts. Tungsten is used to fill the contact hole which is then commonly referred to as a plug. A layer of metal or "first metal" is then deposited over the surface of the semiconductor. Typically aluminum is sandwiched in between layers of titanium, titanium/tungsten alloy or titanium nitride. The metal sandwich overlies the layer of dielectric and electrically contacts the plugs so as to allow for contact between the first metal layer and the semiconductor devices. The first metal layer is then masked and etched so as to form metal lines or routing "interconnects" which connect to the various semiconductor devices through the vertical contacts. Alternate layers of dielectric and metal are then formed over the first metal layer, where subsequent vertical through-hole interconnects are referred to as "vias".

As the complexity of computing devices and data storage devices has increased, there has been a need to place more semiconductor devices on each computer chip. This need has led to smaller and smaller devices and interconnects. However, as devices and interconnects have become smaller and smaller the process limitations of depositing and etching metal so as to form interconnects has imposed limitations on further size reductions in processing technology. This is primarily due to the limitations imposed by the patterning (lithography and etch) process. These limitations make increasingly smaller interconnects difficult if not impossible to etch since the interconnects are extremely small, and since they must be spaced closely together. The inability to control the metal etch process with the needed degree of accuracy leads to non uniform interconnect width or to shorts between adjacent metal lines. The non-uniform interconnect width leads to electrical cross-talk between interconnects and non uniform resistance between interconnects of equal length. As processing devices get smaller and smaller, the inaccuracies in the depth and width of the metal layer interfere to an increasing degree with signal processing. Variable line resistance can result in signal delay which creates timing problems. In addition, incomplete etch in tightly pitched metal etch processes causes yield loss and drives up manufacturing costs.

One recent process for obtaining the small metal lines and contacts needed for the 0.18 micrometer process generation and for subsequent smaller processing generations is the use of damascene processing techniques. In damascene processing techniques, devices and gates are created as described above. The dielectric layer which is typically an oxide, commonly referred to as an Inter Metal Oxide (IMO) is deposited over the semiconductor surface. The oxide layer is polished so as to obtain a planar upper surface. Prior art FIG. 1A shows semiconductor substrate 115 after oxide layer 108 has been deposited over gates 106-107 and over semiconductor substrate 115 and after polishing of oxide layer 108 so as to obtain a planar upper surface.

Oxide layer 108 is then masked and etched to form openings or vias for contact between the semiconductor devices and a first metal layer. Prior art FIG. 1B shows semiconductor device 100 after mask and etch steps have formed via 109. Via 109 exposes a portion of gate 107.

A second mask and etch process is then performed to form trenches in the top of the oxide layer. Prior art FIG. 1C shows the structure of prior art FIG. 1B after mask and etch steps have formed trench 111 and trench 112 within oxide layer 108. Trench 112 partially overlies via 109.

A metal layer is then deposited over the semiconductor surface such that it fills the vias and the trenches. As shown in prior art FIG. 1D, metal layer 120 fills via 109 and trenches 111-112 and it overlies the top surface of oxide layer 108.

The metal which overlies the top surface of the IMO is removed by a chemical mechanical polishing (CMP) step. As shown in prior art FIG. 1E, the polishing step removes that portion of metal layer 120 which overlies the top of oxide layer 108 so as to form a planar surface and so as to form interconnect 125 and interconnect 126 and contact 127. Contact 127 electrically connects interconnect 126 to gate 107. This process leaves a planar surface and allows for the formation of small, closely spaced interconnects and contacts.

The success of damascene processes is primarily due to the fact that it is generally easier to etch oxides than it is to etch metal since there is more margin for error (oxide under etching changes the resistance but does not cause a short). Moreover, by using oxide etch processes, thinner structures and closer spacing between structures are possible than are possible using metal etch techniques. Another advantage of damascene processes is the ability to use copper as a material for interconnects and contacts. Since copper is hard to etch, it is seldom used in current wafer processing systems. However, copper may be deposited such that it fills the trenches and vias and it may be polished so as to obtain a damascene structure with copper interconnects and contacts.

The depth of the trenches is controlled by the use of timed etches. Though the use of timed etches is currently the best method for obtaining the required depth for the trenches, the timed etch processes produces trenches with non uniform depths. The depths of individual trenches vary when using timed etch techniques due to pattern density effects, RIE lag (reduced etch rates for smaller openings), center to edge non uniformity, and wafer to wafer non uniformity. Since the depths of the trenches of the damascene process varies due to the timed etch process, the interconnects formed have non-uniform thicknesses. The non-uniform thicknesses between interconnects causes non-uniform resistivity between interconnects which leads to timing problems and signal interference. Moreover, the non-uniform thickness between interconnects decreases yield and throughput.

Recent prior art processes have used a stop layer of silicon nitride as an etch stop. In these processes a first oxide layer is deposited over a semiconductor substrate such that it overlies gate, source and drain structures. The first oxide layer is planarized and a layer of silicon nitride layer is deposited over the first oxide layer. A second oxide layer is then deposited over the silicon nitride layer. A conventional oxide etch is used to etch through the second oxide layer to expose the silicon nitride layer. However, since a different etch chamber and/or etch chemistry is required to etch through silicon nitride, the plasma feed gas is changed to a different chemistry before etching the silicon nitride layer. An etch chemistry of, for example, one part hydroflorocarbon to ten parts $O_2$ may be used to etch through the silicon nitride layer.

After etching through the silicon nitride layer where desired (e.g. above gate or sources or drains), the wafer is stripped of photoresist and remasked in a pattern indicating trench locations. The wafer is then etched again using an oxide etch chemistry to remove portions of the first oxide layer so as to form a via extending to the gate or source or drain to be contacted. Simultaneously, the second oxide layer is being etched so as to form trenches. Since a standard oxide etch will not etch through the silicon nitride layer, portions of the silicon nitride layer will form the bottom surface of trenches. Therefore, the bottom surfaces of the trenches will be uniform and planar. The presence of the remaining nitride serves as a hard mask for the completion of the concurrent via etch. Next, a metal layer is deposited and polished to complete the damascene formed structure.

Though the use of silicon nitride as an etch stop allows for the formation of interconnects having relatively planar bottom surfaces, expensive additional process steps are required. In particular, the wafer must be placed in a separate high vacuum plasma CVD reactor for nitride deposition. In addition, since the chemistry needed to etch silicon nitride is oxygen rich (different from the chemistry of oxide etch processes), the etchant must be changed between steps. This also adds processing time and resist is consumed, which degrades the etch profile as the etch proceeds.

Thus, a need exists for a damascene-formed structure which includes interconnects having uniform thicknesses. A further need exists for a method for forming a damascene structure which minimizes fab process time and which allows for the less expensive manufacture of damascene structures. Moreover, a damascene structure and a method for forming a damascene structure is needed that will increase yield and throughput of manufacturing. The present invention meets the above needs.

DISCLOSURE OF THE INVENTION

The present invention provides a damascene-formed structure which has interconnects with uniform depths. The present invention achieves the above accomplishments with a method of forming a damascene structure which uses a layer of non-stochiometric oxide dielectric as an etch stop. A layer of stochiometric oxide is then deposited over the etch stop layer. Vias are formed with mask and etch steps using a non selective etch process. Next, trenches are formed in mask and etch steps using a selective etch process which selectively etches only the stochiometric oxide layer so as to form trenches which have uniform depths.

In one embodiment of the present invention, semiconductor devices are formed over a semiconductor substrate. A first dielectric layer is then deposited over the surface of the semiconductor substrate. In one embodiment of the present invention, the first dielectric layer is formed by the chemical vapor deposition of a non-stochiometric oxide. The first dielectric layer is then planarized by polishing the surface of the dielectric.

A second layer of dielectric material is then deposited over the first layer of dielectric material. In one embodiment the second dielectric layer is formed by the chemical vapor deposition of a stochiometric oxide over the semiconductor substrate. In an alternate embodiment of the present invention, Tetraethylorthosilicate (TEOS) is used to form the second dielectric layer. In yet another embodiment, inexpensive spin on glass (SOG) is used to form the first dielectric layer. After the selective etch is completed, the mask is removed.

Vias are then formed in the first and second dielectric layers by mask and etch steps. Non-selective etch chemicals are used to etch through both the second dielectric layer and through the first dielectric layer. Any of a number of known different etch chemistries can be used to perform the non-selective etch of the stochiometric oxide and non-stochiometric oxide of the first dielectric layer and the second dielectric layer. The mask is then removed.

A mask which is patterned so as to define the interconnect structure is then formed over the second dielectric layer. A selective etch is then performed. An etch chemistry which selectively etches the second dielectric layer is used such that the etching process stops at the top of the first dielectric layer. In one embodiment of the present invention an etch using Argon, $CF_4$, carbon monoxide, $C_4F_8$ and helium is used.

A layer of conductive material is deposited over the semiconductor substrate such that the conductive material fills the vias and fills the trenches. In one embodiment, copper is used as the conductive material. Alternatively, aluminum may be used as the conductive layer.

The layer of conductive material is then polished using chemical mechanical polishing (CMP) techniques. The CMP process stops at the top of the second dielectric layer so as to form interconnects within the trenches and so as to form contacts within the vias. Since the bottom surface of each of the trenches lies against the top surface of the first dielectric layer, and since the top surface of the first dielectric layer is planar, the bottom surfaces of the interconnects are planar. This results in interconnects having uniform thicknesses. Thus, the resistivity is relative uniform between interconnects having the same length. This gives consistent resistivity between interconnects within individual semiconductor devices and consistent wafer to edge uniformity and consistent wafer to wafer uniformity.

These and other advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

Prior Art

Prior Art

Prior Art

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

FIGS. 2–8 illustrate the steps for forming a semiconductor device according to one embodiment of the present invention which includes a damascene structure. First, a layer of dielectric is deposited over the semiconductor substrate. In one embodiment of the present invention, the first dielectric layer is a non-stochiometric oxide. The non-stochiometric oxide may be, for example, $SiO_x$ (where x is less than 2) formed from silane precursor material using Plasma Enhanced Chemical Vapor Deposition (PECVD) methods in an oxygen-starved environment.

Figure 1A:
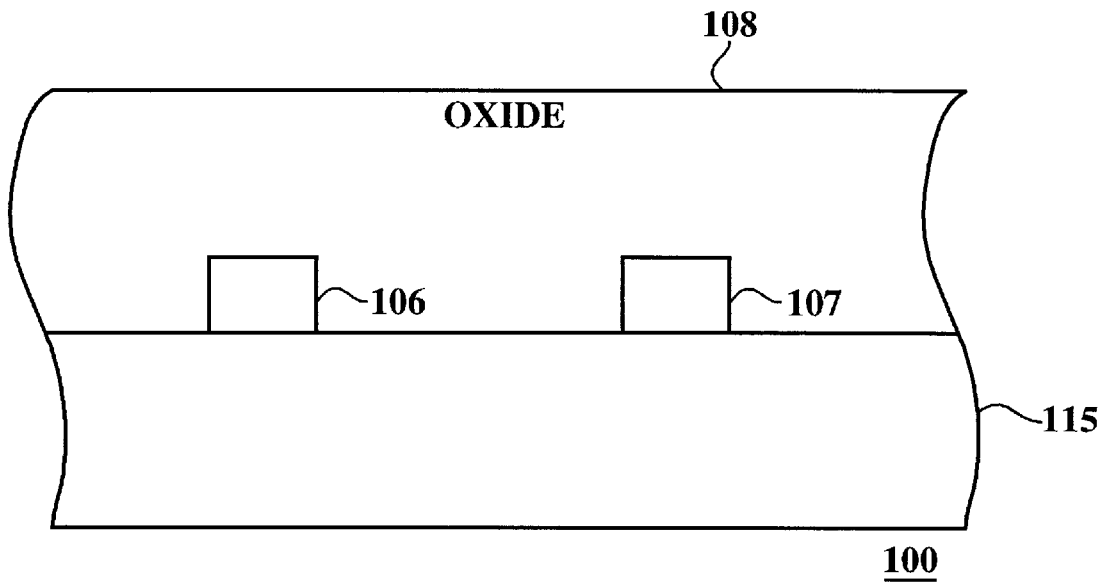
FIG. 1A is a cross-sectional view illustrating steps associated with a prior art damascene process.
Figure 1B:
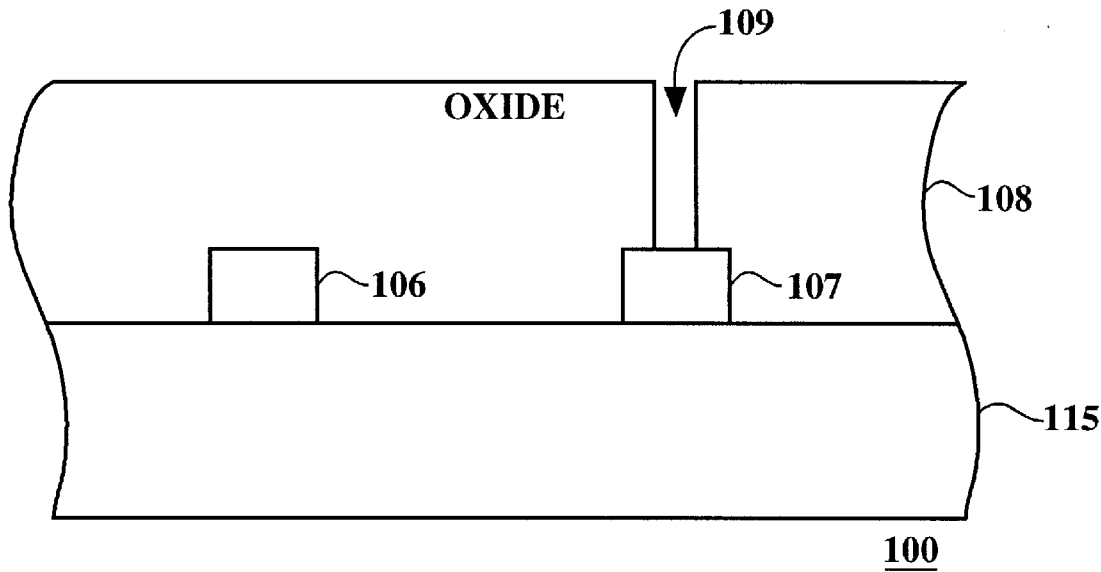
FIG. 1B is a cross-sectional view illustrating steps associated with a prior art damascene process.
Figure 1C:
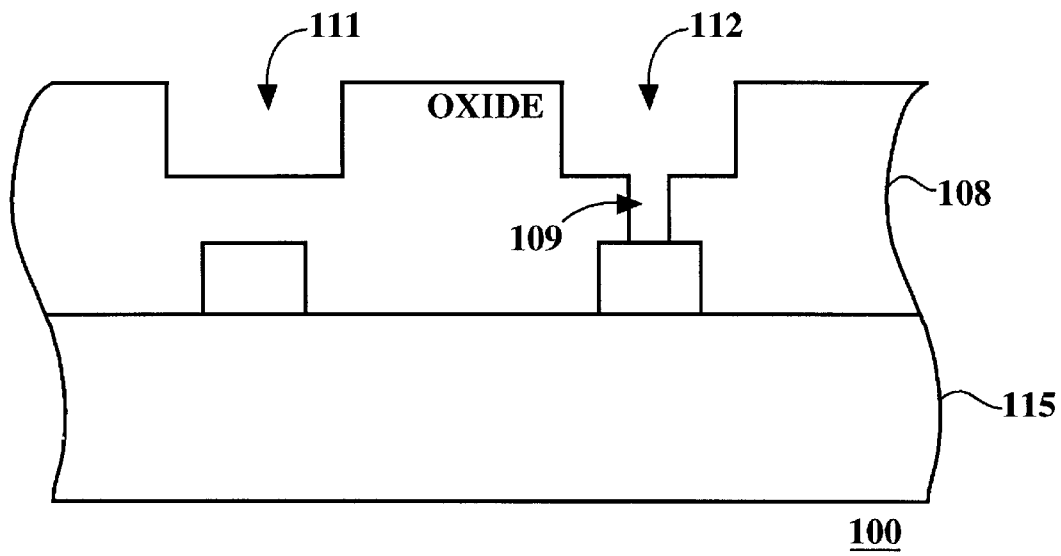
FIG. 1C is a cross-sectional view illustrating steps associated with a prior art damascene process.
Figure 1D:
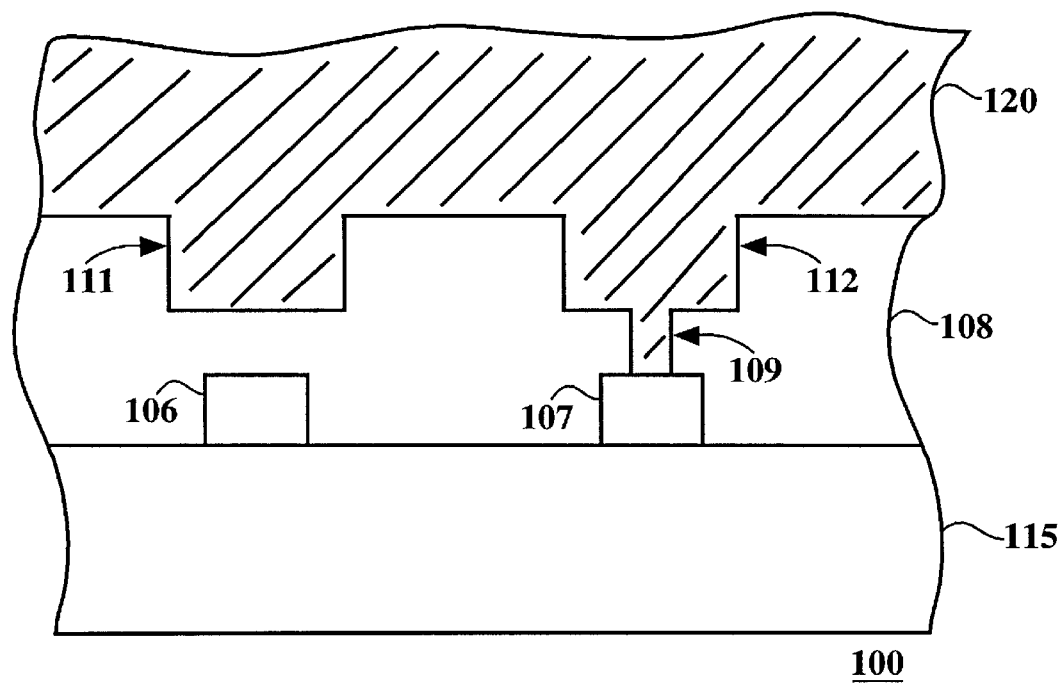
FIG. 1D is a cross-sectional view illustrating steps associated with a prior art damascene process.
Figure 1E:
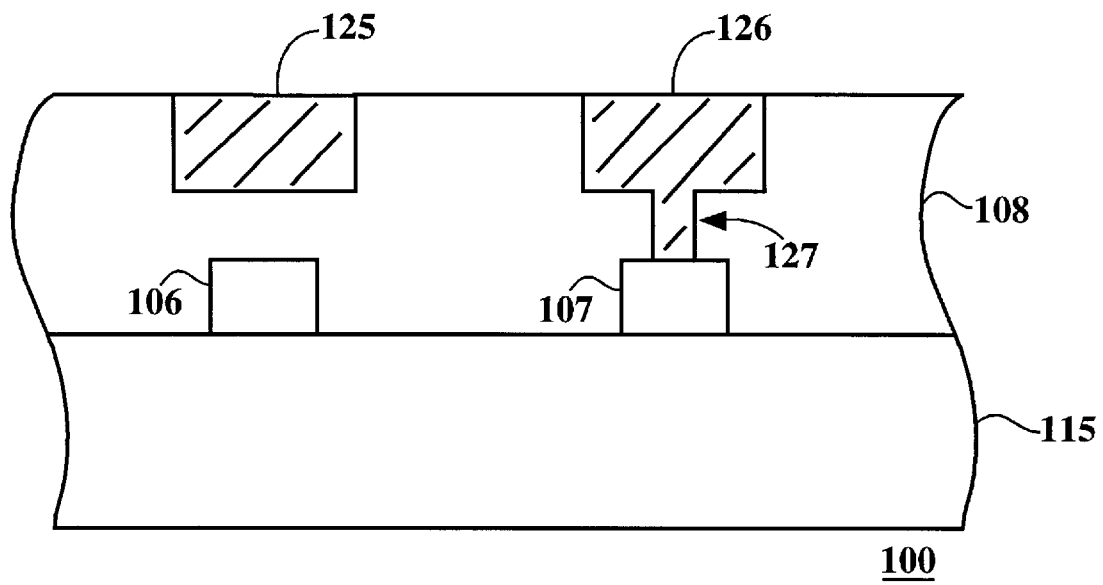
FIG. 1E is a cross-sectional view illustrating steps associated with a prior art damascene process.
Figure 2:
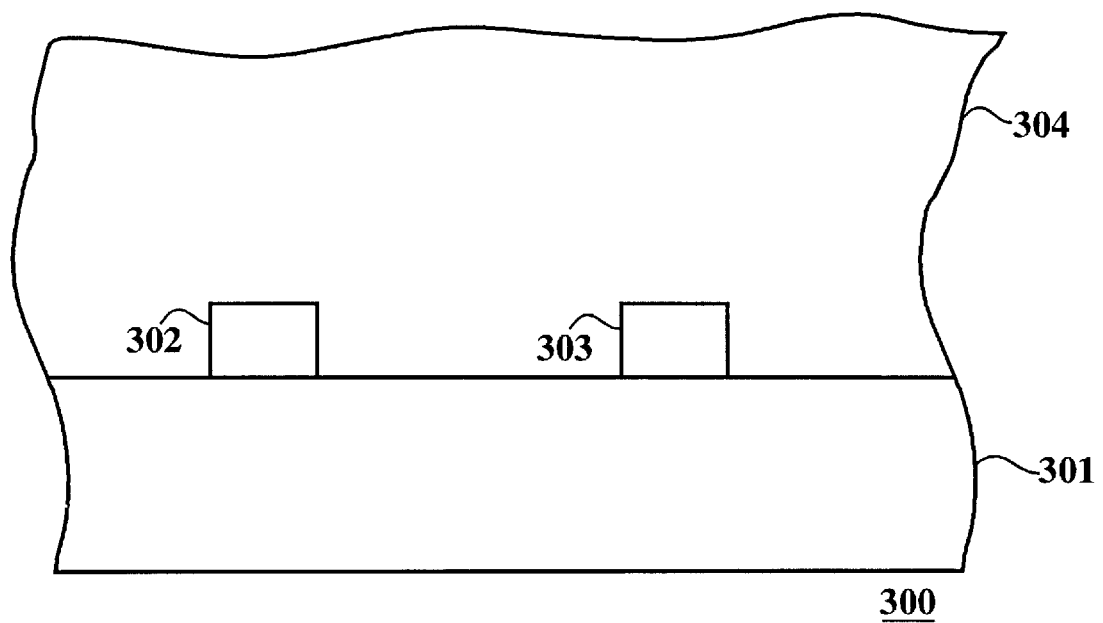
FIG. 2 is a cross-sectional view illustrating a step associated with the formation of a semiconductor device having a damascene formed structure in accordance with the present claimed invention.

FIG. 2 shows dielectric layer 304 deposited over semiconductor device 300. Semiconductor device 300 includes substrate 301 which has semiconductor devices formed thereon which include gates 302-303. Dielectric layer 304 is deposited over substrate 301 and over gates 302-303. It can be seen that the deposition of dielectric layer 304 has a top surface which is not planar due to the deposition of dielectric over gates 302-303.

Figure 3:
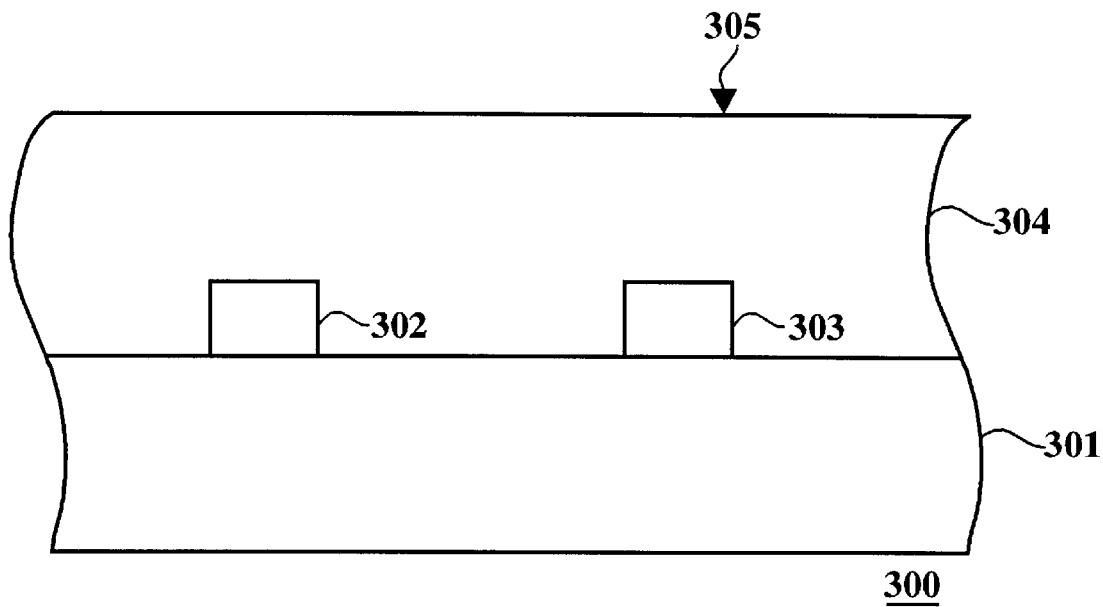
FIG. 3 is a cross-sectional view illustrating a step associated with the formation of a semiconductor device having a damascene formed structure in accordance with the present claimed invention.

Dielectric layer 304 is then planarized by polishing the surface of dielectric layer 304. FIG. 3 shows the structure of FIG. 2 after dielectric layer 304 has been polished. It can be seen that top surface 305 of dielectric layer 304 is planar as a result of the polishing process.

Figure 4:
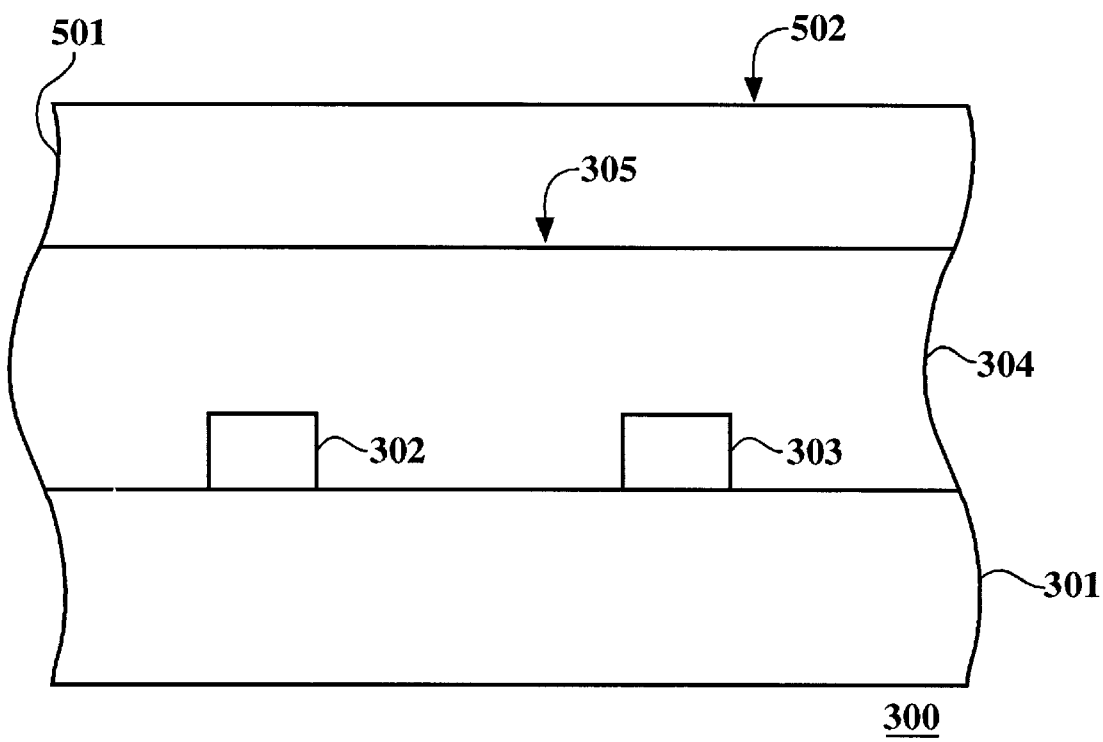
FIG. 4 is a cross-sectional view illustrating a step associated with the formation of a semiconductor device having a damascene formed structure in accordance with the present claimed invention.

A second layer of dielectric material is then deposited over the semiconductor substrate. In one embodiment the second dielectric layer is a stochiometric oxide formed by the plasma assisted chemical vapor deposition of a liquid or gaseous silicate precursor such as TEOS (Tetra Ethyl Ortho Silicate). FIG. 4 shows the structure of FIG. 3 after the deposition of dielectric layer 501. Dielectric layer 501 includes top surface 502. Top surface 502 is relatively planar since top surface 305 of the underlying layer, dielectric layer 304, is planar.

Vias are formed in dielectric layer 304 and dielectric layer 501 of FIG. 4 by mask and etch steps. Non-selective etch hardware and chemicals are used to etch through both dielectric layer 304 and through dielectric layer 501. In one embodiment a high density plasma is used to achieve an acceptable throughput at the high aspect ratio. Any of a number of different etch chemistries could be used to perform the non-selective etch. For example, when using a stochiometric oxide as dielectric layer 501 and a non-stochiometric oxide as dielectric layer 304, a non-selective etch chemistry such as a standard oxide etch may be used. For example, a non-selective etch chemistry of 300 standard cubic centimeters (sccm) Ar and 80 sccm $CF_4$ and 15 sccm He may be used. This etch may be performed using an oxide etcher such as the LAM 4520XL with a wafer area pressure of 193 mt, a chamber pressure of 60 mt, an 800 Watt top electrode, a 1000 watt bottom electrode, a distance between electrodes of 1.33 cm and at a temperature of 40 degrees centigrade for both top and bottom electrodes of the etcher. The LAM oxide etcher is manufactured by LAM Research, Inc. of San Jose, Calif. Alternatively, a high density plasma etch could be used to get a faster etch rate and a high aspect ratio etch. This type of etch could be performed using a LAM 9100, or an Applied Materials HDP etcher.

Figure 5:
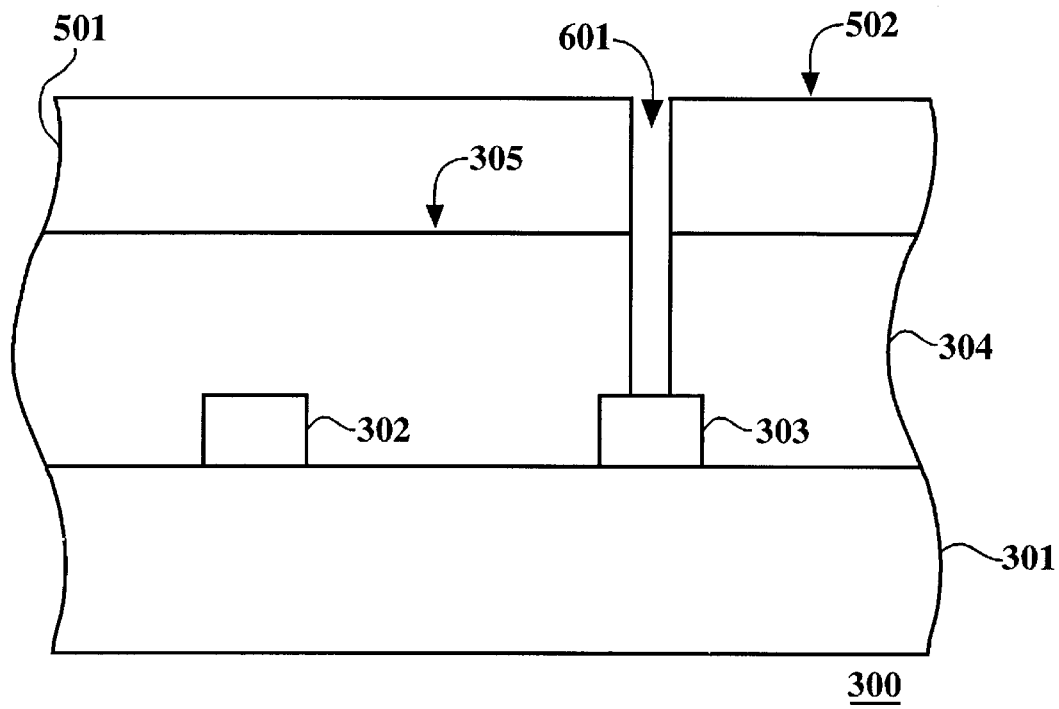
FIG. 5 is a cross-sectional view illustrating a step associated with the formation of a semiconductor device having a damascene formed structure in accordance with the present claimed invention.

FIG. 5 shows the structure of FIG. 4 after mask and etch steps have formed via 601. Via 601 is shown to extend through dielectric layer 501 and through dielectric layer 502 so as to expose the top surface of gate 303. Alternatively, connection could be to sources (not shown) or drains (not shown) or local interconnects (not shown) if desired.

Figure 6:
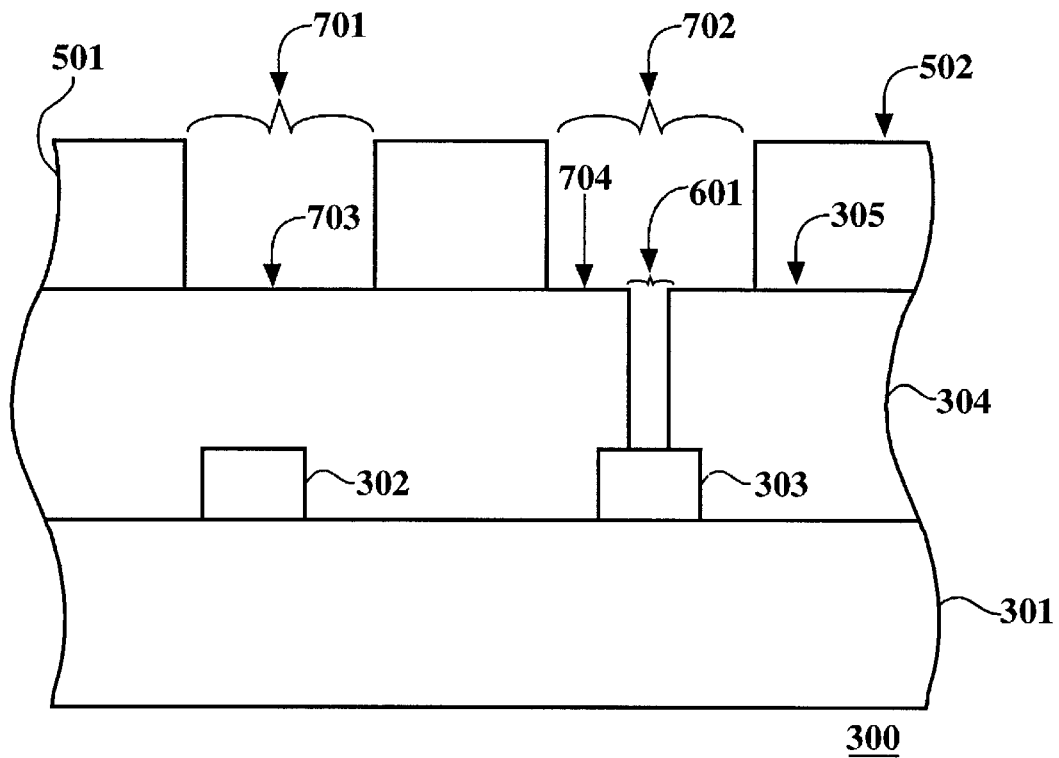
FIG. 6 is a cross-sectional view illustrating a step associated with the formation of a semiconductor device having a damascene formed structure in accordance with the present claimed invention.

A mask which is patterned so as to define the lateral metal interconnect structure is formed over the substrate and a selective etch is then performed. An etch chemistry which selectively etches dielectric layer 501 is used such that the etching process stops at top surface 305 of dielectric layer 304 of FIG. 5. FIG. 6 shows the structure of FIG. 5 after mask and etch steps have been performed so as to define trenches 701-702. Trench 701 includes bottom surface 703 and trench 702 includes bottom surface 704. Trench 702 overlies via 601 so as to expose gate 303. Since a selective etch process is used which selectively etches dielectric layer 501 and which does not etch dielectric layer 304, the bottom surface 703 of trench 701 is planar and bottom surface 704 of trench 702 is planar due to the planarity of top surface 305 of dielectric layer 304.

By using a non-stochiometric oxide of dielectric layer 304 as an etch stop and when using a stochiometric oxide as dielectric layer 501, etches having a selectivity of greater than 10 to 1 may be obtained. For the selective etch, an etch chemistry of 300 standard cubic centimeters (sccm) Ar and 2 sccm $CF_4$ and 150 sccm CO and 2 sccm $C_4F_8$ and 15 sccm He may be used. This etch may be performed using an oxide etcher such as the LAM 4520XL with a wafer area pressure of 193 mt, a chamber pressure of 60 mt, a 800 Watt top electrode, a 1000 watt bottom electrode, a distance between electrodes of 1.33 cm and at a temperature of 40 degrees centigrade for both top and bottom electrodes of the etcher.

Alternate methods for forming non stochiometric oxides include the incorporation of carbon using TEOS deposited in an oxygen starved environment, or by incorporation of nitrogen as in PECVD SiON. In an alternate embodiment of the present invention, spin on glass (SOG) is used to form dielectric layer 304. The SOG architecture may be etched using the same selective etch process and the same non-selective etch process as are used to etch silane-based silicon rich oxide. When SOG is used to form dielectric layer 304, the etch selectivity achievable (oxide to SOG) is on the order of 10:1. SOG deposition produces a relatively planar top surface. Therefore, in an embodiment using SOG to form dielectric layer 304, if desired, the polishing step may be eliminated or reduced.

In yet another embodiment of the present invention, Tetraethylorthosilicate (TEOS) or other similar silicate precursor may be used to form dielectric layer 501. TEOS may be etched selectively and non-selectively using the same etch process as is used to etch stochiometric oxide. TEOS may be selectively etched with a selectivity of greater than 10 to 1 when either SOG or another non-stochiometric oxide is used as a stop layer. TEOS may be deposited using thermal decomposition in a tube in a high temperature deposition step so as to produce a high density stochiometric oxide (the Silicon is fully oxidized at the high temperature). Alternatively, TEOS or a similar silicate precursor materials may be deposited using a PECVD process.

Figure 7:
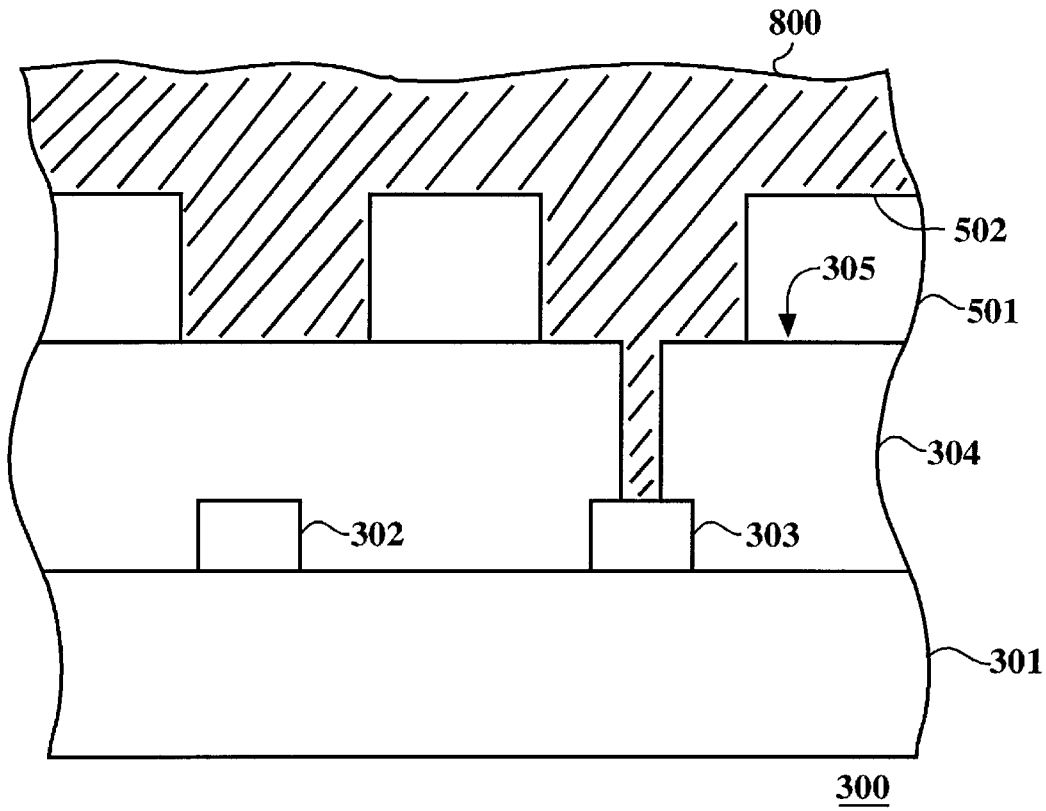
FIG. 7 is a cross-sectional view illustrating a step associated with the formation of a semiconductor device having a damascene formed structure in accordance with the present claimed invention.

A layer of conductive material is then deposited over the semiconductor substrate such that the conductive material fills the vias and fills the trenches. In the present embodiment, this conductive material is a metal. In one embodiment, copper is used as the conductive material and it is deposited using sputtering deposition methods. FIG. 7 shows the structure of FIG. 6 after metal layer 800 is deposited over the surface of semiconductor device 200. It can be seen that metal layer 800 fills via 601 and trenches 701-702 of FIG. 6.

Figure 8:
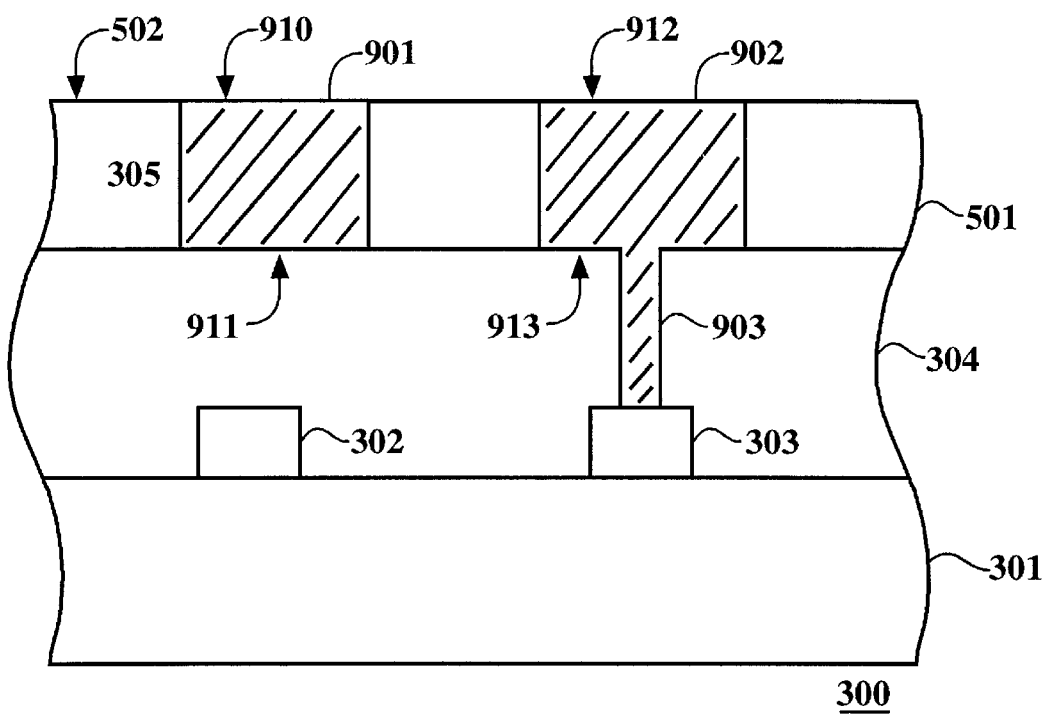
FIG. 8 is a cross-sectional view illustrating a step associated with the formation of a semiconductor device having a damascene formed structure in accordance with the present claimed invention.
Figure 9:
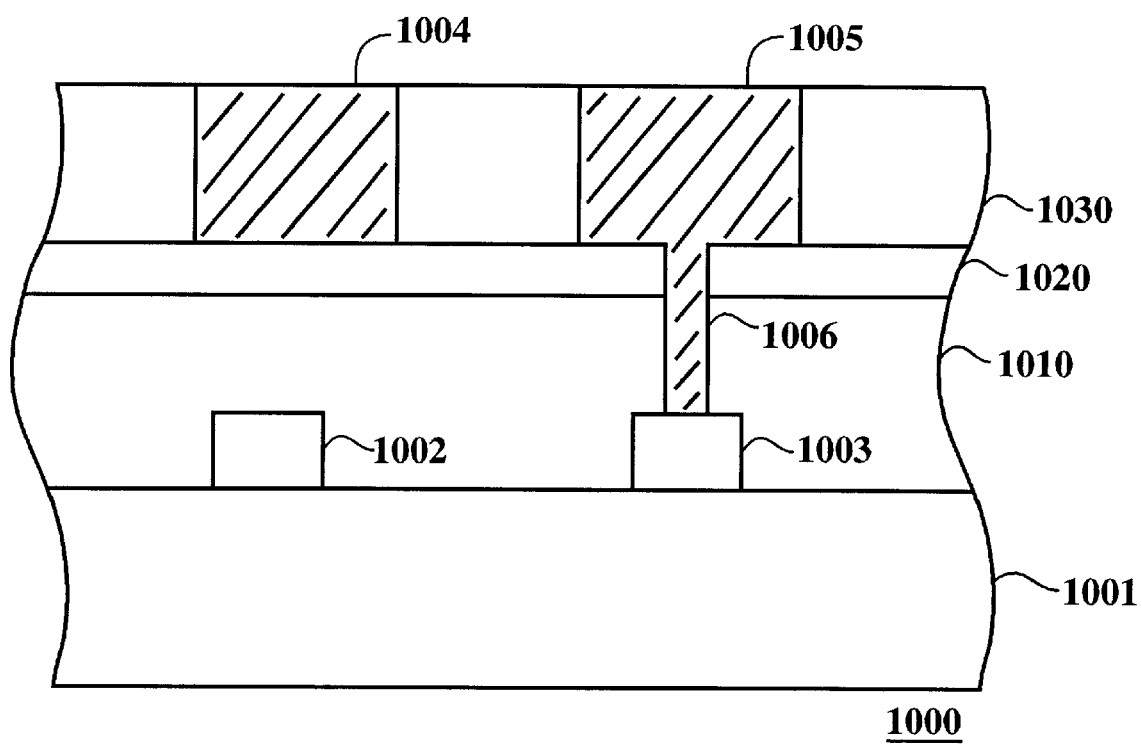
FIG. 9 is a cross-sectional view illustrating a semiconductor device having a damascene formed structure in accordance with the present claimed invention.

The layer of metal is then polished. In one embodiment of the present invention, chemical mechanical polishing (CMP) techniques are used to polish metal layer 800. A CMP process which stops at top surface 502 of dielectric layer 501 is used. The CMP process uses a chemistry which will selectively etch metal during the polishing process but which will not etch dielectric layer 501 so as to remove that portion of metal layer 800 which overlies top surface 502 of dielectric layer 501. With reference to FIG. 8, this polishing step forms interconnect 901, interconnect 902 and contact 903 within semiconductor device 100. Contact 903 electrically couples interconnect 902 with gate 303.

With reference again to FIG. 8, interconnect 901 includes top surface 910 and bottom surface 911 and interconnect 902 includes top surface 912 and bottom surface 913. Bottom surface 911 and bottom surface 913 are planar due to the planarity of bottom surface 703 and bottom surface 704. Top surface 910 and top surface 912 are planar as a result of the CMP step. Thus, interconnect 901 and interconnect 902 have a constant depth. This constant depth gives uniform electrical characteristics across the length of each of interconnects 901-902. For example, the resistance of interconnects 901-902 is constant for a given length of interconnect. This gives consistent resistance between interconnects within individual semiconductor devices of equal length and between interconnects in different lots of semiconductor devices. Thus, the present invention gives edge to edge uniformity and wafer to wafer uniformity for interconnects.

In another embodiment conductive layer 800 of FIG. 7 is copper deposited by chemical vapor deposition (CVD) or electroplating processes. The use of electroplating to deposit copper over the surface of the semiconductor substrate is an inexpensive method for depositing the copper. Alternatively, aluminum may be used to form conductive layer 800 of FIG. 7. In an embodiment which uses aluminum, the conductive layer 800 may be aluminum deposited using sputtering deposition methods or using force-fill methods. In force-fill methods, a high pressure is used to force the aluminum into the vias and into the trenches.

In yet another embodiment, a layer of dielectric is deposited over the surface of the semiconductor device prior to forming the structures shown in FIGS. 1–7. In this embodiment, layer of dielectric 1010 is deposited over the surface of semiconductor device 1000 which includes gates 1002-1003 formed over substrate 1001. Etch stop layer 1020 and dielectric layer 1030 are then deposited thereover. In one embodiment, etch stop layer 1020 is a non stochiometric oxide and dielectric layer 1030 is a stochiometric oxide. Alternatively, TEOS may be used to form dielectric layer 1010 and dielectric layer 1030. Selective mask and etch steps are used to form a via opening to the etch stop layer and then selectivity is reversed to open the oxy-nitride for continued etching. A selective etch process is used to form trenches within dielectric layer 1030 as the via is simultaneously etched. A metal layer is then deposited and polished so as to form interconnects 1004-1005 and contact 1006. By using non-stochiometric oxide as an etch stop, all of the dielectric layers may be deposited in the same deposition chamber. This saves the capital equipment expense associated with using a separate high vacuum PECVD chamber as is required in prior art processes that use silicon nitride as an etch stop. Moreover, throughput is increased and manufacturing time and expense is reduced.

In yet another embodiment of the present invention, nitrogen-enriched silicon oxide may be used to form etch stop layer 1002. Though a special high vacuum PECVD chamber must be used to deposit the layer of nitrogen enriched silicon oxide, the layer also functions as an anti reflective layer for photolithography. The anti reflective characteristics of the nitrogen-enriched silicon oxide layer optimizes feature definition, preventing foot formation at the base of developed resist, and thereby minimizes vertical striations during etching.

It is far easier to control the thickness of a deposition than it is to control an etch depth from a manufacturing process point of view. Thus, by using an etch stop to set the etch depth of the interconnects, the present invention eliminates the need to perform precision timed etches. In the present invention, since precision timed etch processes are not required, the problems associated with timed etch processes such as process variations and drift are avoided. Thus, the present invention overcomes the problems in the prior art resulting from the inability to precisely control etch depth in timed etch processes.

Manufacturing and processing cost is lowered because reject rate is reduced. In particular, the number of rejected or returned devices resulting from timing problems and signal interference are reduced since the present invention produces interconnects having uniform electrical properties. In addition, since the timed etch process is expensive, time consuming and difficult to control, throughput is improved.

The use of non stochiometric oxides as a stop layer decreases the number and complexity of process steps for etching contacts and vias relative to a nitride stop layer. The step of depositing a layer of nitride is eliminated in favor of using the same tool for TEOS and Silicon rich oxide, or alternatively in favor of using an inexpensive, non-vacuum, spin-on process (e.g. SOG). In addition, the wafer does not have to be moved to a special etching device to etch the silicon nitride layer. By decreasing the number of process steps and the complexity of process steps, the present invention decreases cost and increases throughput. Moreover, by eliminating the complex processing steps of silicon nitride deposition with its associated etch, the present invention increases yield.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A method for forming a damascene structure on a semiconductor substrate having semiconductor devices formed thereon comprising:

a) depositing a layer of non-stoichiometric oxide over said semiconductor substrate;

b) planarizing said layer of non-stoichiometric oxide;

c) depositing a layer of stoichiometric oxide over said layer of non-stoichiometric oxide;

d) masking and etching said layer of stoichiometric oxide and said layer of non-stoichiometric oxide with a non-selective etch process so as to etch said layer of non-stoichiometric oxide and so as to etch said layer of stoichiometric oxide so as to form openings within said layer of non-stoichiometric oxide and within said layer of stoichiometric oxide;

e) masking and etching said semiconductor substrate with a selective etch process so as to selectively etch portions of said layer of stoichiometric oxide so as to form a plurality of trenches within said layer of stoichiometric oxide, said layer of non-stoichiometric oxide forming an etch stop so as to form trenches having a uniform depth, said step of masking and etching said semiconductor substrate with a selective etch immediately following step d);

f) depositing a layer of metal over said semiconductor substrate such that a portion of said layer of metal overlies said layer of stoichiometric oxide and such that said layer of metal is deposited within said openings within said layer of non-stoichiometric oxide and within said plurality of trenches; and g) polishing said semiconductor substrate so as to remove that portion of said layer of metal that overlies said layer of stoichiometric oxide so as to form interconnects within said trenches and so as to form contacts within said openings in said layer of non-stoichiometric oxide such that said contacts selectively electrically couple said interconnects to said semiconductor devices.

2. The method for forming a damascene structure of claim 1 wherein said step of planarizing said layer of non-stoichiometric oxide further comprises:

polishing said first dielectric layer such that said top surface of said layer of non-stoichiometric oxide has a relatively planar surface.

3. The method for forming a damascene structure of claim 1 wherein said layer of metal comprises copper.

4. The method for forming a damascene structure of claim 1 wherein said layer of metal comprises aluminum.

5. The method for forming a damascene structure of claim 1 wherein said layer of non-stoichiometric oxide comprises $SiO_x$, with x being a number less than two.

6. The method for forming a damascene structure of claim 3 wherein said selective etch process includes an etching environment wherein said semiconductor substrate is exposed to gas, said etch process further comprising the steps of:

introducing Argon into said etching environment at a rate in the range of approximately 300 standard cubic centimeters per minute;

introducing $CF_4$ into said etching environment at a rate in the range of approximately 2 standard cubic centimeters per minute;

introducing carbon monoxide into said etching environment at a rate in the range of approximately 150 standard cubic centimeters per minute;

introducing helium into said etching environment at a rate in the range of approximately 15 standard cubic centimeters per minute; and introducing $C_4F_8$ into said etching environment at a rate in the range of approximately 2 standard cubic centimeters per minute.

7. A method for forming a damascene structure on a semiconductor substrate having semiconductor devices formed thereon comprising:

a) depositing a first layer of stoichiometric oxide over said semiconductor substrate;

b) depositing a layer of non-stoichiometric oxide over said semiconductor substrate;

c) depositing a second layer of stoichiometric oxide over said layer of non-stoichiometric oxide;

d) masking and etching said layer of non-stoichiometric oxide and said first layer of stoichiometric oxide and said second layer of stoichiometric oxide so as to form a via;

e) masking and etching said semiconductor substrate with a selective etch process so as to selectively etch portions of said second layer of stoichiometric oxide so as to form a plurality of trenches within said second layer of stoichiometric oxide, said layer of non-stoichiometric oxide forming an etch stop so as to form trenches having a uniform depth, said step of masking and etching said semiconductor substrate with a selective etch immediately following step d);

f) depositing a layer of metal over said semiconductor substrate such that a portion of said layer of metal overlies said second layer of stoichiometric oxide and such that said layer of metal is deposited within said via and within said plurality of trenches; and g) polishing said semiconductor substrate so as to remove that portion of said layer of metal that overlies said second layer of stoichiometric oxide so as to form interconnects within said trenches and so as to form contacts within said via such that said contacts selectively electrically couple said interconnects to said semiconductor devices.

8. The method for forming a damascene structure of claim 7 wherein said layer of metal comprises aluminum.

9. The method for forming a damascene structure of claim 7 wherein said layer of metal comprises copper.

* * * * *